(12) United States Patent
Engala et al.

(10) Patent No.: US 8,742,842 B2
(45) Date of Patent: Jun. 3, 2014

(54) HIGH EFFICIENCY POWER AMPLIFIER ARCHITECTURE FOR OFF-PEAK TRAFFIC HOURS

(75) Inventors: Kodanda R Engala, Irving, TX (US); Darrell Barabash, Grapevine, TX (US)

(73) Assignee: Nokia Siemens Networks Oy, Espoo (FI)

( * ) Notice: Subject to any disclaimer, the term of this patent is extended or adjusted under 35 U.S.C. 154(b) by 0 days.

(21) Appl. No.: 13/590,482

(22) Filed: Aug. 21, 2012

(65) Prior Publication Data

US 2014/0055195 A1 Feb. 27, 2014

(51) Int. Cl.
*H03F 3/68* (2006.01)

(52) U.S. Cl.
USPC ........... 330/124 R; 330/295; 330/51; 330/129

(58) Field of Classification Search
USPC ................ 330/124 R, 295, 51, 129
See application file for complete search history.

(56) References Cited

U.S. PATENT DOCUMENTS

| | | | |
|---|---|---|---|
| 6,472,934 B1 * | 10/2002 | Pehlke | 330/10 |
| 7,064,606 B2 * | 6/2006 | Louis | 330/124 R |
| 7,382,186 B2 * | 6/2008 | Apel et al. | 330/129 |
| 7,385,445 B2 * | 6/2008 | Wright | 330/51 |
| 8,130,043 B2 * | 3/2012 | Arell | 330/302 |
| 8,254,854 B2 * | 8/2012 | Wang et al. | 455/108 |
| 8,514,007 B1 * | 8/2013 | Ahmed et al. | 327/355 |
| 2010/0208638 A1 | 8/2010 | Kawaji | 370/311 |
| 2013/0109434 A1 * | 5/2013 | Dupuy et al. | 455/552.1 |

FOREIGN PATENT DOCUMENTS

| | | |
|---|---|---|
| EP | 1032120 A2 | 8/2000 |
| EP | 1521376 A1 | 4/2005 |
| WO | WO-03/065598 A1 | 8/2003 |

OTHER PUBLICATIONS

Steve C. Cripps, "Revisiting the Doherty PA", Hywave Associates (2008) (30 pages).
ETSI TS 102 706 V1.1.1 (Aug. 2009) Technical Specification Environmental Engineering (EE) Energy Efficiency of Wireless Access Network Equipment (31 pages).
3GPP TS 36.423 V10.2.0 (Jun. 2011) 3rd Generation Partnership Project; Technical Specification Group Radio Access Network; Evolved Universal Terrestrial Radio Access Network (E-UTRAN); X2 application protocol (X2AP) (Release 10) (130 pages).

(Continued)

*Primary Examiner* — Patricia Nguyen
(74) *Attorney, Agent, or Firm* — Harrington & Smith

(57) ABSTRACT

A power amplifier architecture includes high and low power paths. The high power path may include a number of different amplifier structures. The low power path includes a switching element configured to short a signal line to ground or provide an open between the signal line and ground. The low power path and an output of the high power path are summed at a summing junction. Circuitry, responsive to one or more control signals, is configured in a high power mode to turn on amplifier(s) in the amplifier structure, route an input signal through a driver amplifier to the high power path and place the switching element in one of the open/closed positions; the circuitry is configured in a low power mode to turn off the amplifier(s), route the input signal through a driver amplifier to the low power path and place the switching element in the other position.

20 Claims, 13 Drawing Sheets

(56) References Cited

OTHER PUBLICATIONS

ETSI TS 102 706 V1.6.1 (Jun. 2011) Environmental Engineering (EE) Measurement Method for Energy Efficiency of Wireless Access Network Equipment (57 pages).

Choi, Jinsung, et al.; "Optimized Envelope Tracking Operation of Doherty Power Amplifier for High Efficiency Over an Extended Dynamic Range," *IEEE Transactions on Microwave Theory and Techniques*, vol. 57, No. 6, Jun. 2009, pp. 1508-1515.

\* cited by examiner

HIGH EFFICIENCY POWER AMPLIFIER ARCHITECTURE FOR OFF-PEAK TRAFFIC HOURS

TECHNICAL FIELD

This invention relates generally to wireless communications and, more specifically, relates to architectures for power amplifiers.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below at the end of the specification but prior to the claims.

In modern communication systems such as cellular systems, data to be transmitted is amplified prior to transmission. For instance, a base station in WCDMA/LTE/GSM radio access technologies (RATs) uses a power amplifier to amplify data prior to transmission. The power amplifiers in these base stations may produce average power during high traffic hours of 40-60 watts of RF power, with peak wattage ranging into the hundreds of watts for short durations during peak traffic hours.

During off-peak hours (e.g., when there is very little radio traffic demand), such as at night, the power amplifiers are transmitting very low power (e.g., 10-20 percent of average power), which are typically the control signals of the base station cell site. Even when the low power is being transmitted, the power amplifiers may burn, e.g., four to six watts of transmitted RF power and about 70-100 watts of DC power. For a single power amplifier, this does not sound like a large amount of power. However, the current trend, in order to keep up with data rate increases and especially for urban areas, is to install many smaller base stations. These smaller base stations vary in power, but are generally quite a bit smaller in power than a typical "macro" base station. Nonetheless, the off-hour power consumption of the smaller base stations and their associated power amplifiers is still significant, especially when DC power consumption is considered.

It would be beneficial to reduce the off-hour power consumption of power amplifiers and their corresponding base stations.

SUMMARY

This section contains examples of possible implementations and is not meant to be limiting.

An apparatus in an exemplary embodiment includes a power amplifier architecture. The power amplifier architecture includes a high power path including one or more amplifiers having one or more outputs coupled to an input of a first impedance transformer, the first impedance transformer having an output. The power amplifier architecture also includes a low power path including a signal line and an impedance transformation network, the impedance transformation network having a first terminal coupled to the signal line and a second terminal coupled to the output of the first impedance transformer. The power amplifier architecture additionally includes a switching element having a first terminal coupled to the signal line and having a second terminal coupled to ground, the switching element in a closed position shorting the signal line to ground and in an open position providing an open between the signal line and ground. The power amplifier architecture further includes a summing junction having an output and summing the output of the first impedance transformer and the second terminal of the impedance transformation network. The power amplifier architecture additionally includes circuitry, responsive to one or more control signals, configured in a high power mode to turn on at least one of the one or more amplifiers, to route an input signal through a driver amplifier to the high power path and to place the switching element in one of the open position or closed position selected to cause an open impedance looking from the summing junction into the second terminal of the impedance transformation network, the circuitry configured in a low power mode turn off the at least one amplifier, to route the input signal through a driver amplifier to the low power path and to place the switching element in the other of the open position or closed position.

Another exemplary embodiment includes computer program product including a computer-readable storage medium bearing computer program code embodied therein for use with a computer. The computer program code includes code for determining whether a power amplifier architecture should be in high power mode or low power mode. The power amplifier architecture includes a high power path including one or more amplifiers having one or more outputs coupled to an input of a first impedance transformer, the first impedance transformer having an output. The power amplifier architecture also includes a low power path including a signal line and an impedance transformation network, the impedance transformation network having a first terminal coupled to the signal line and a second terminal coupled to the output of the first impedance transformer. The power amplifier architecture additionally includes a switching element having a first terminal coupled to the signal line and having a second terminal coupled to ground, the switching element in a closed position shorting the signal line to ground and in an open position providing an open between the signal line and ground. The power amplifier architecture further includes a summing junction having an output and summing the output of the first impedance transformer and the second terminal of the impedance transformation network. The power amplifier architecture additionally includes circuitry, responsive to one or more control signals, configured in a high power mode to turn on at least one of the one or more amplifiers, to route an input signal through a driver amplifier to the high power path and to place the switching element in one of the open position or closed position selected to cause an open impedance looking from the summing junction into the second terminal of the impedance transformation network the circuitry configured in a low power mode turn off the at least one amplifier, to route the input signal through a driver amplifier to the low power path and to place the switching element in the other of the open position or closed position. The computer program code comprising code for operating the one or more control signals in order to place the power amplifier architecture either in the high power mode or in the low power mode.

DETAILED DESCRIPTION OF THE DRAWINGS

Figure 1:
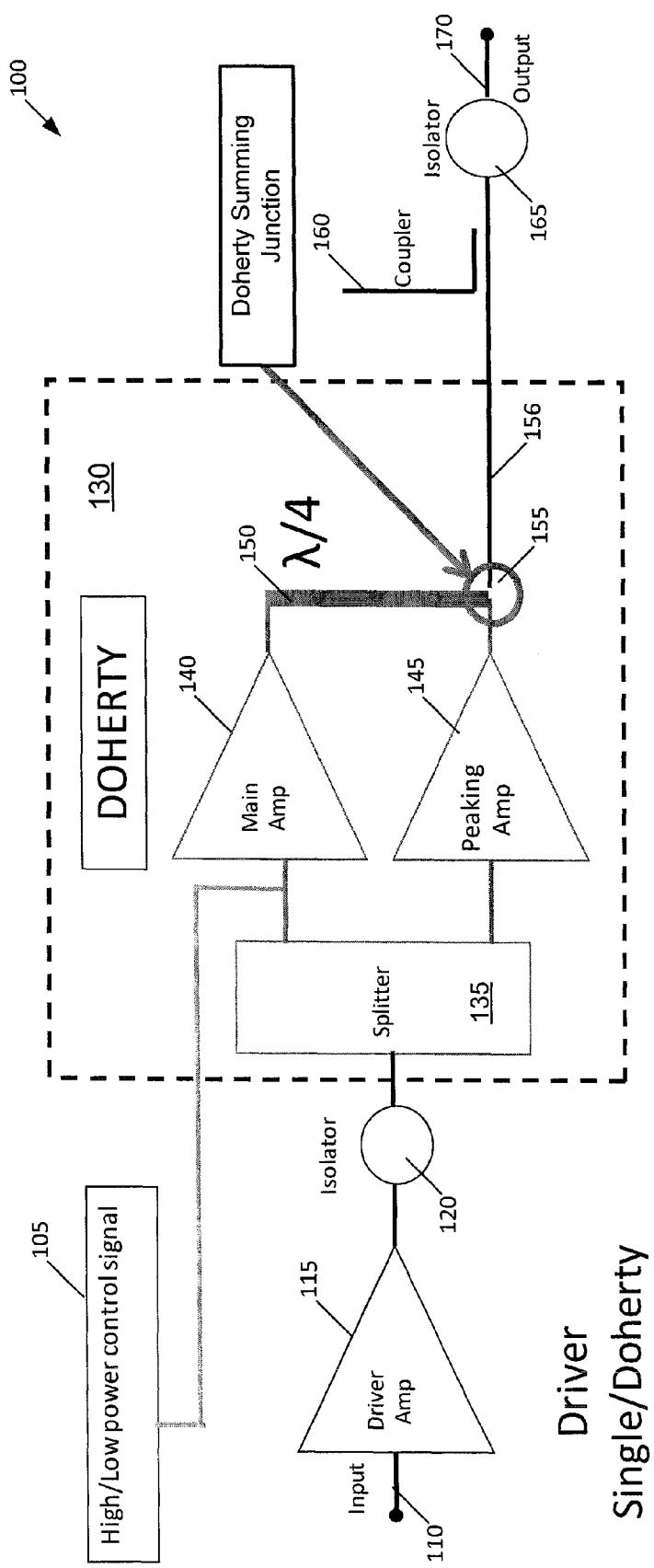
FIG. 1 is an illustration of a power amplifier architecture comprising a Doherty power amplifier structure.

Before proceeding to describe the exemplary embodiments herein, it is first helpful to describe a typical power amplifier architecture. Turning to FIG. 1, an illustration is shown of a power amplifier architecture 100 comprising a Doherty power amplifier structure 130. There is a single driver amplifier 115 that accepts an input 110 and outputs through an isolator 120 into the Doherty power amplifier structure 130. The Doherty power amplifier structure 130 outputs through a coupler 160 and an isolator 165 to produce an output 170 of the power amplifier architecture 100.

The Doherty power amplifier structure 130 has two amplifiers, the main amplifier 140 and a peaking amplifier 145. The control signal 105 is a binary signal used to signal high or low power. The input to the Doherty power amplifier structure 130 passes through the splitter 135. The main amplifier 140 is typically biased class AB and the peaking amplifier 145 is typically biased class C. The peaking amplifier 145 turns ON only for the duration of the peaks. The Doherty power amplifier structure 130 is better suited for digital modulated signals with high peak to average ratios.

The outputs of the main and the peaking amplifiers are connected through a Doherty combiner and the combining point is called Doherty summing junction 155. The main amplifier 140 output in this example passes through an impedance transformer 150, e.g., a quarter wave ($\lambda/4$) transformer. There is an impedance transformer (shown as isolator 165) from the Doherty summing junction to a 50 Ohms load (not shown).

At the Doherty summing junction 155, looking into the peaking amplifier 145 is an RF open. The peaking amplifier 130 is only a current source. Depending on the level of input signal line 110, the peaking amplifier 145 sources current and thus modulates the load seen by the main amplifier 140. The load of the main amplifier 140 (that is, looking from the main amplifier 140 into the impedance transformer 150) will be modulated between the transformer impedance (e.g., 100 Ohms) and 50 Ohms.

In more detail, as shown in FIG. 1, the Doherty power amplifier structure 130 configuration has two independent amplifiers, main 140 and peaking 145. Peak power is rated power plus max PAR of the composite signal. As an example for a radio with rated power of 47.8 dBm (e.g., a 60 watt radio) and max PAR of 7.4 dB, the peak power is 55.2 dBm.

Depending on the PAR of the composite transmitted signal, the peaking amplifier 145 is biased such that the peaking amplifier 145 turns on only for the duration of the peaks. Thus, the peaking amplifier 145 is not drawing any DC power (Idq=0) when the composite signal is below rated power. Meanwhile, the main amplifier 140 is biased AB (typically) and is delivering most of the power until the peak power is above rated power and the peaking amplifier 145 will start to kick in. The main amplifier is biased at a certain Idq current and this DC power is always consumed. The combining point for peaking and main amplifier is called, as stated previously, the Doherty summing junction (marked in FIG. 1 as the summing junction 155) and the summing junction 155 creates the composite signal 156.

There is a $\lambda/4$ transformer (shown in this example as the isolator 165) that connects the summing junction to an external world 50 Ohms load. For a two-way symmetric Doherty power amplifier structure 130, the $\lambda/4$ transformer transforms the 50 Ohms load to 25 Ohms. The Zo of the $\lambda/4$ transforms is 35.4 Ohms (i.e., SQRT(25×50)). There is another $\lambda/4$ transformer 150 that connects the output of the main amplifier 140 to the Doherty summing junction 155.

The Doherty amplifier explanation can be split into two sections: when peaking is OFF; and when peaking is ON.

When peaking is OFF, when the composite signal peak power is well below the rated power, and the peaking amplifier 145 is OFF. The peaking amplifier matching circuit is designed in such a way that the matching circuit provides an open at the summing junction 155 looking into the peaking amplifier 155. This is performed based on the off-state impedance of the transistor (comprising the peaking amplifier 145 in an exemplary embodiment). Generally, the S11 of transistors are very low impedance (e.g., one to five Ohms) and the matching network will transform the S11 of the transistors to the other side of Smith chart.

Since the peaking amplifier 145 is not loading the summing junction 155, the main amplifier 140 is connected to the 25 Ohms which is transformed to 100 Ohms due to the $\lambda/4$ transformer 150 between main amplifier 140 and the summing junction 155. Thus, the load of the main amplifier 140 is modulated between 100 ohms and 50 Ohms (this part will be explained in reference to the peaking ON mode below). It can also be seen that when the load is 100 Ohms, the main amplifier 140 will be efficient because the amplifier will be seeing a higher impedance load.

When peaking is ON, when the peak power of the composite signal 156 is above the rated power, the peaking amplifier will turn ON. In a symmetric Doherty power amplifier, the main amplifier and peaking amplifier are delivering the same amount of power when the composite signal 156 is at the peak power.

Since now the peaking amplifier and the main amplifier are delivering power to the load (not shown), the impedance seen by the main amplifier and peaking amplifier is 50 Ohms (2×25 Ohms). Since the load seen is 50 Ohms, the $\lambda/4$ transformer 150 between the main amplifier 140 and summing junction 155 does not do anything other than just phase change around 50 Ohms. In this mode, the main amplifier 140 and the peaking amplifier 145 are seeing a load of 50 Ohms, which is the high power impedance as the composite signal 156 is at peak power.

Figure 2A:
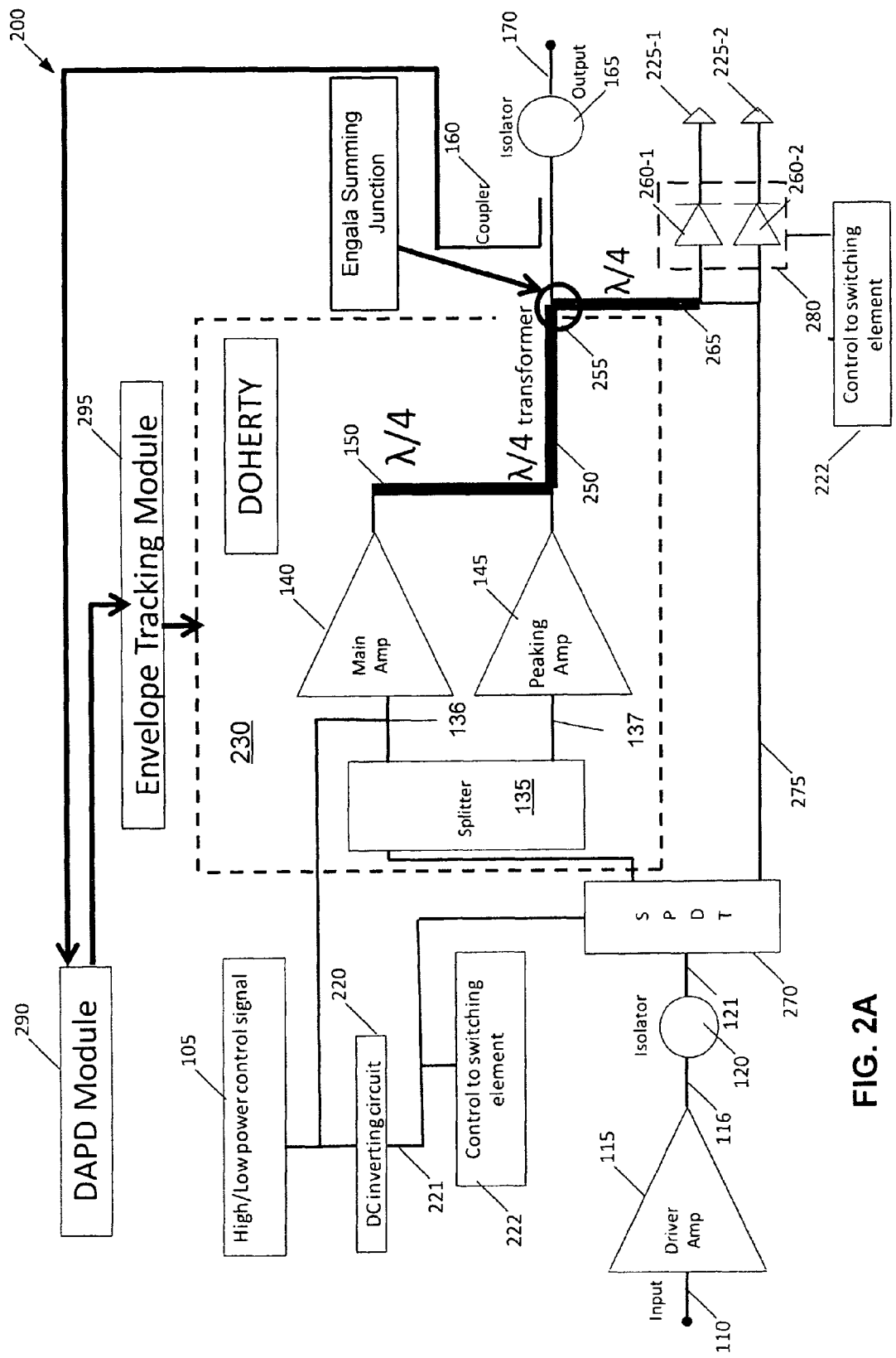
FIG. 2A is an illustration of a power amplifier architecture, comprising a Doherty power amplifier structure, in accordance with an exemplary embodiment of the instant invention.
Figure 3A:
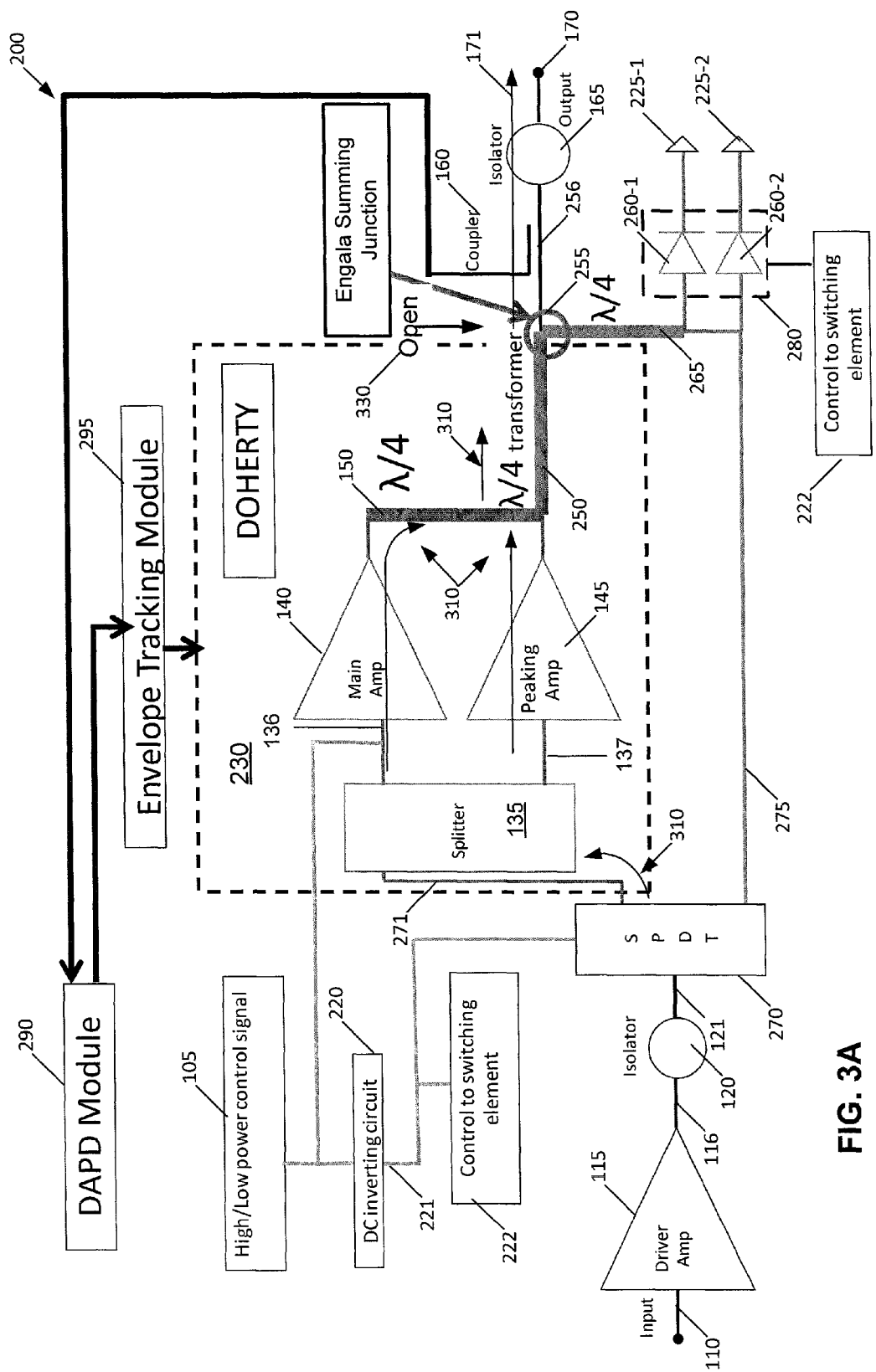
FIG. 3A is an illustration of the power amplifier architecture of FIG. 2A for a high power mode.
Figure 3B:
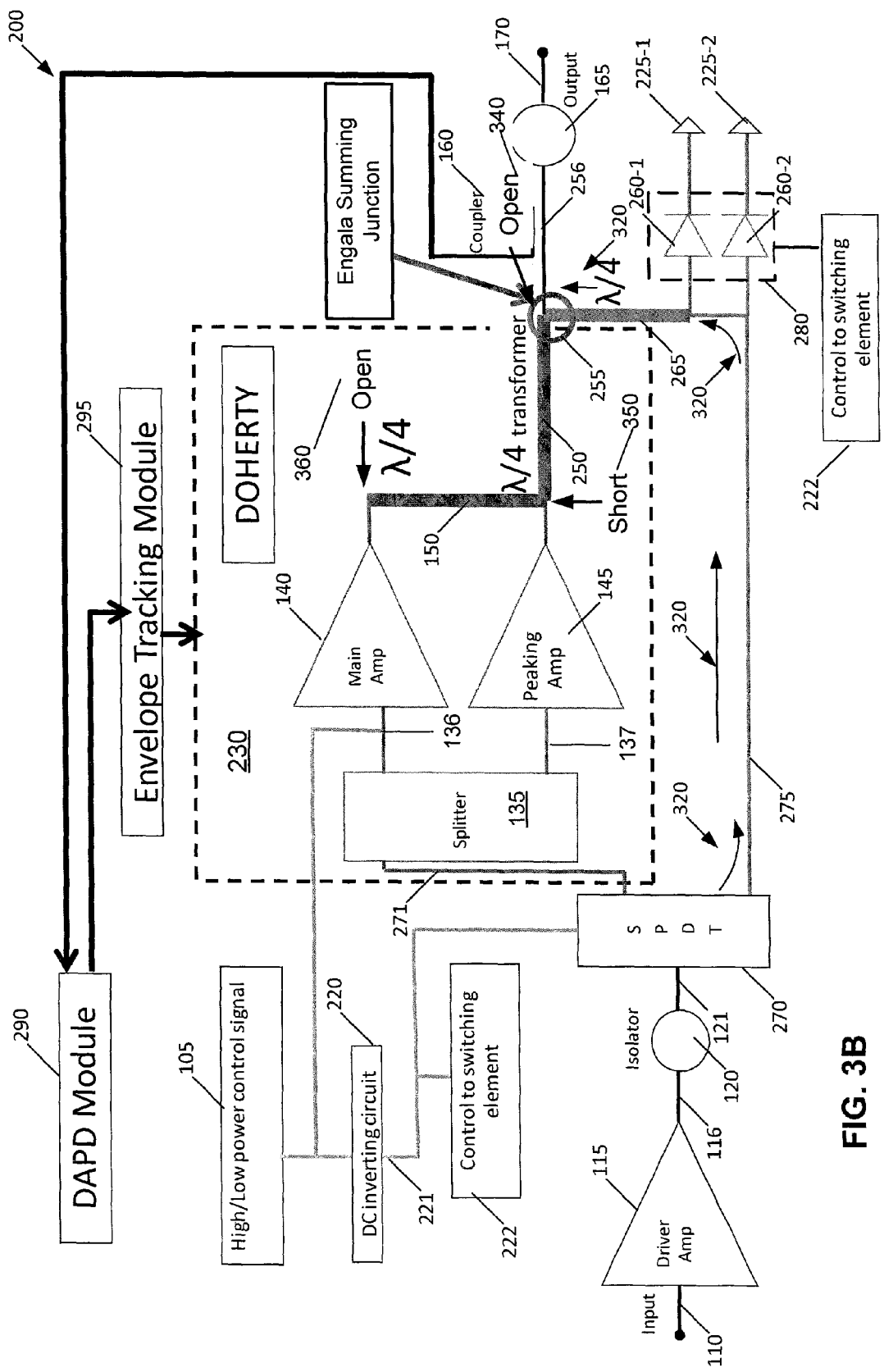
FIG. 3B is an illustration of the power amplifier architecture of FIG. 2A for a low power mode.

Turning now to the exemplary embodiments, the exemplary embodiments herein reduce power during, e.g., off-peak hours. FIG. 2A is an illustration of a power amplifier architecture, comprising a Doherty power amplifier structure, in accordance with an exemplary embodiment of the instant invention. First, the elements in FIG. 2A are introduced and some exemplary comments will be provided. Subsequently, FIGS. 3A and 3B are used to illustrate high (3A) and low (3B) power transmission modes as aides to understanding an exemplary embodiment of the invention.

In FIG. 2A, the power amplifier architecture 200 comprises the high/low power control signal 105, the input signal 110, the driver amplifier 115, the isolator 120, the splitter 135, the main amplifier 140, the peaking amplifier 145, the impedance transformer 150, the coupler 160, the isolator 165, and the output 170 as described above in reference to FIG. 1. The power amplifier architecture 200 further comprises an optional DAPD module 290, an optional envelope tracking module 295, a DC inverting circuit (e.g., a logic inverter) 220, a control signal 221, a SPDT switch 270, a signal line 275, an impedance transformer 265, a switching element 280, ground(s) connection(s) 225, and a modified Doherty power amplifier structure 230. The Doherty power amplifier structure 230 in this example further includes a second impedance transformer 250 (e.g., a quarter wave, λ4, transformer). The second impedance transformer 250 is connected to a summing junction 255 called an Engala summing junction herein. The Engala summing junction 255 is also connected to another impedance transformer 265 (e.g., a quarter wave, λ/4, transformer). One or both of the DAPD module 290 or the envelope tracking module 295 may be used (e.g., the DAPD module 290 could be used without the envelope tracking module 295).

The DC inverting circuit 220 is a logic inverter and is configured so that when the control signal line 105 has an appropriate signal for a high power mode, the switch 270 is configured to route the signal from the isolator 120 to the splitter 135. The DC inverting circuit 220 is also configured so that when the control signal line 105 has an appropriate signal for a low power mode, the switch 270 is configured to route the signal from the isolator 120 to the signal line 275. The DC inverting circuit 220 may not be necessary in certain embodiments. The DC inverting circuit 220 creates a control signal 221, which is also routed as control signal 222 to the switching element 280.

It should be noted that the terms "signal" and "signal line" may be used interchangeably herein. Also, the term "line" is not meant to be limiting, and could be single or multiple "lines", each of which may be traces on a motherboard, conductive wires in a semiconductor, individual wires, and the like. It is also noted that the lines 222, 221, and 105 form part of circuitry that is responsive to one or more control signals on the lines 222, 221, and 105 to be configured in a high power mode to turn on the amplifier(s) 140, 145, to route an input signal 110 through a driver amplifier (e.g., 115) to a high power path (e.g., 310, see below) and to place the switching element 280 in the closed position. The circuitry is also configured in a low power mode to turn off the amplifier(s) 140, 150, to route the input signal 110 through a driver amplifier (e.g., 105) to a low power path (e.g., 320, see below) and to place the switching element 280 in the open position.

The SPDT switch 270 is one example of switch 270 and the switch 270 is not limited to an SPDT switch. The control signal 222 is a control signal configured to operate the switching element 280. The switching element 280 is in this example two fast switching PIN diodes 260-1 and 260-2, but this is merely exemplary and the switching element 280 may be a varactor, one or more FETs, one or more mechanical switches (e.g., microelectromechanical systems or switches), one or more bipolar transistors, a combination of these, or the like. The operation of the two fast switching diodes 260-1 and 260-2 are described below.

Based on the Doherty explanation above, one can see how the Doherty configuration (130 or 230) improves efficiency by biasing off (Idq=0 and DC power consumption=0, zero, watts) the peaking amplifier 145 until there are peaks above certain threshold. The main amplifier 140 in the Doherty configuration 130/230 is always ON (DC power=Idq*Vdd=45 watts per power amplifier structure 130/230 for a 60 watt radio). For a three pipe unit, the Doherty power amplifier structure 130/230 quiescent power consumption may be about 135 Watts per unit (3×45 watts).

The proposed architecture bypasses the final power amplifier stage (i.e., the Doherty power amplifier structure 230) during low power mode and thus has huge power savings during low power mode. That is, the Doherty power amplifier structure 230 is bypassed with minimum extra loss in the full rated power scenario (i.e., high power mode), and the architecture 200 switches to low power mode where a lot of DC power is saved during, e.g., low traffic periods of the day. The RF performance of the architecture 200 can be explained in two examples, the first of which concerns a high power mode, and the second of which concerns a low power mode (e.g., during night time and off peak hours).

Referring to FIG. 3A, an illustration is shown of the power amplifier architecture of FIG. 2A for a high power mode. In the high power mode, the control signal 105 is low (in this example) and the Doherty amplifier structure 230 (i.e., the main amplifier 140 and the peaking amplifier 145) works as normal (i.e., as previously described). The DC inverter circuit 220 uses the control signal 105 and toggles the SPDT switch 270 to a high power path 310 and turns ON the PIN diodes 260-1 and 260-2. The high power path 310 includes the signal lines 271, 136, 137, and the path through the impedance transformers 150 and 250, and to the Engala summing junction 255. An output path 171 is shown that begins at an output of the Engala summing junction 255, and progress along signal line 256, through the coupler 160, through the isolator 165, and to the output 170.

When the PIN diodes 260-1, 260-2 are ON, they are almost an RF short to ground (e.g., 0.5-1 Ohm) and the λ/4 transformer 265 between the PIN diodes 260 and the Engala summing junction 255 provides an open (as represented by reference 330) looking into the λ/4 transformer 265 at the Engala summing junction 255. The reason for two diodes 260 in parallel is to provide a good short (e.g., by reducing the diode resistance in half) at the diodes and accordingly a good RF open 330 at the Engala summing junction 255 during high power transmission. Thus the λ/4 transformer 265 will not load the Doherty amplifier structure 230 when using the high power path 310 except for some minor implementation losses which are described in more detail below.

FIG. 3B is an illustration of the power amplifier architecture of FIG. 2A for a low power mode. During the low power transmission mode, the control signal 105 is high and the gate bias of the main amplifier 140 in the Doherty amplifier structure 230 is shut off. The Idq=0 and DC power=0 (zero) watts. The DC inverter circuit 220 uses the control signal 105 and toggles (via signal 221) the SPDT switch 270 to the low power path 320 and turns OFF the PIN diodes 260 via the signal 222. The low power path 320 starts at the SPDT switch 270 and proceeds over the signal line 275, through the impedance transformer 265, and to the Engala summing junction 255. The output path 171 (shown in FIG. 3A) includes the signal line 256, passes through the coupler 160, passes through the isolator 165, and passes to the output 170.

Since there is no RF power to the peaking amplifier 145, the peaking amplifier 145 is already off. Since the main amplifier bias is OFF, one can perform impedance matching in such a way that looking into the output of the main amplifier 140 will be an RF open 360 at the input of the 214 transformer 150. This is exactly the same as how peaking amplifier provides an RF open at the Doherty summing junction 155 shown in FIG. 1.

The $\lambda/4$ transformer 150 transforms the RF open 360 to an RF short 350 at the Doherty summing junction. The $\lambda/4$ transformer 250 will transform the RF short 350 to RF open 340 at the Engala summing junction 255. Thus the Doherty amplifier structure 230 will not load the low power path 320.

When the PIN diodes 260 are OFF, they are almost an RF open to ground (~500 Ohm) and the $\lambda/4$ transformer 265 between the PIN diodes 260 and the Engala summing junction 255 just acts as a transmission line and connects to the output coupler 160 and isolator 165. Thus, during low power transmission modes, the DC power consumption of the main amplifier 140 is saved, as otherwise the main amplifier 140 would have always been ON.

It is noted that the driver amplifier 115 is ON for both FIGS. 3A and 3B. For instance, during the low power mode, only the driver amplifier 115 is ON. The switch over power level to low power mode can be changed depending on the type of signal and driver capability. This architecture 200 is improved over existed designs at least in the sense that there is no real switch in the high power path 310, thus minimizing the losses during the high power mode. In an exemplary embodiment, this architecture 200 uses an inherent feature of transistor impedances (where transistors are used for the amplifiers 140, 150) during an OFF state to create an open at the Engala summing junction 255 and thus eliminating the need for a real switch in the high power path 310. Since the driver amplifier 115 will be running closer to compression, the overall efficiency of the driver amplifier also improves. In theory this architecture can be cascaded to provide high efficiency at infinite back off.

Figure 2B:
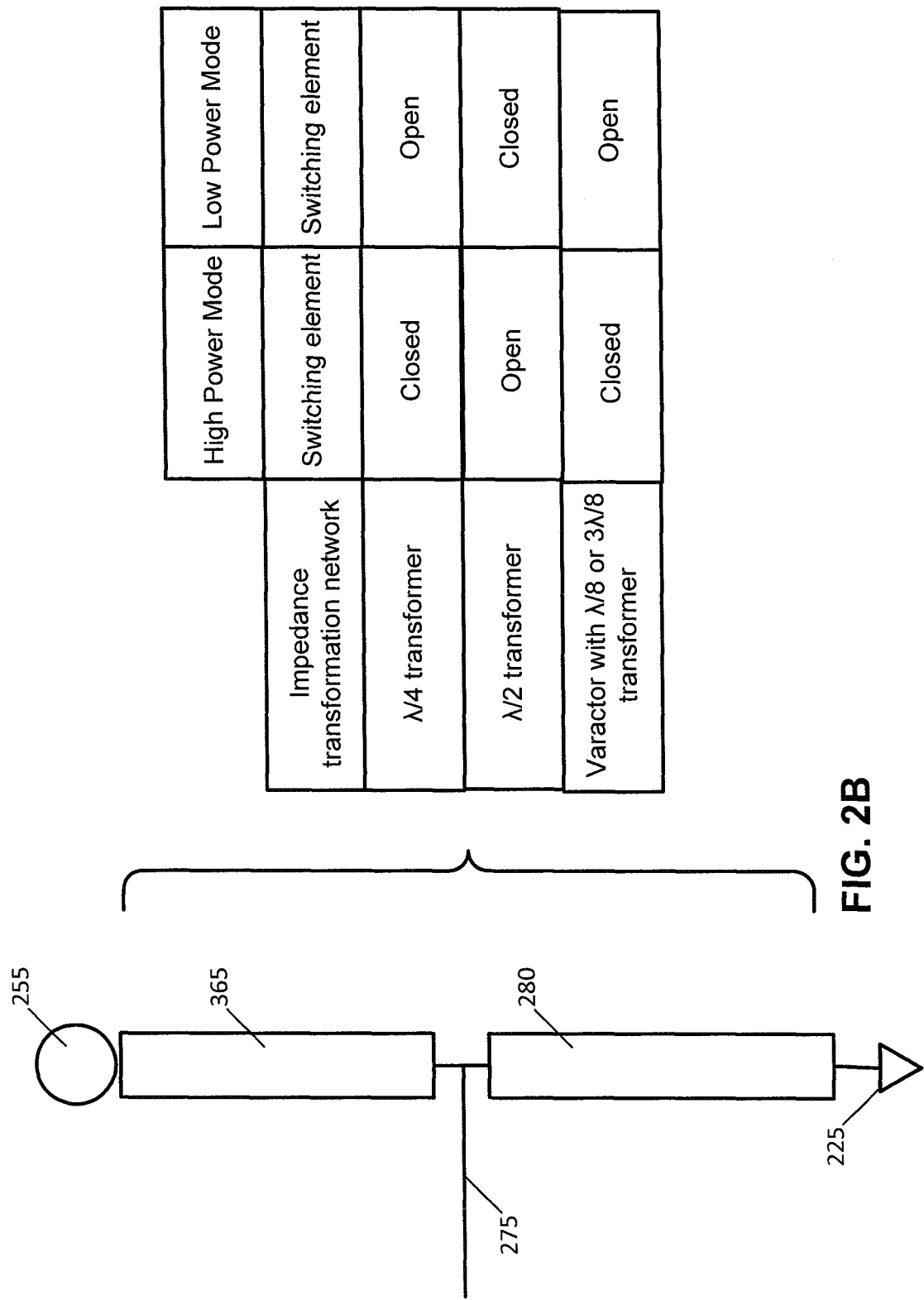
FIG. 2B is an illustration of a portion of the power amplifier architecture of FIG. 2A.

FIG. 2B shows a portion of FIG. 2A. The portion shown includes the Engala summing junction 255, the switching element 280, the ground connection 225, and the signal line 275. The impedance transformer 265 has been replaced by the impedance transformation network 365. In FIGS. 2A, 3A, 3B, and 4-8, the impedance transformer 265 is shown as a quarter wave ($\lambda/4$) transformer and the operation of the switch 280 is as described above and below. However, the impedance transformer may instead be an impedance transformation network 365. The table shown in FIG. 3 illustrates exemplary impedance transformation networks 365 and corresponding position of the switching element 280 during high power mode or low power mode. For an impedance transformation network 365 of a quarter wave ($\lambda/4$) transformer, the switching element is closed (short to ground) for high power mode and is open (between signal line 275 and ground) in low power mode. For an impedance transformation network 365 of a half wave ($\lambda/2$) transformer, the switching element is open for high power mode and is closed for low power mode. For an impedance transformation network 365 of a varactor with an eighth wave ($\lambda/8$) transformer (or a $3\lambda/8$ transformer), the switching element is closed for high power mode and is open for low power mode. In high power mode, the open (e.g., very high) impedance is created looking into the $\lambda/4$ transformer 265 at the Engala summing junction 255. In low power mode, RF signals flow through the low power path. These impedance transformation networks are exemplary and may be used with any power amplifier architecture herein.

Figure 4:
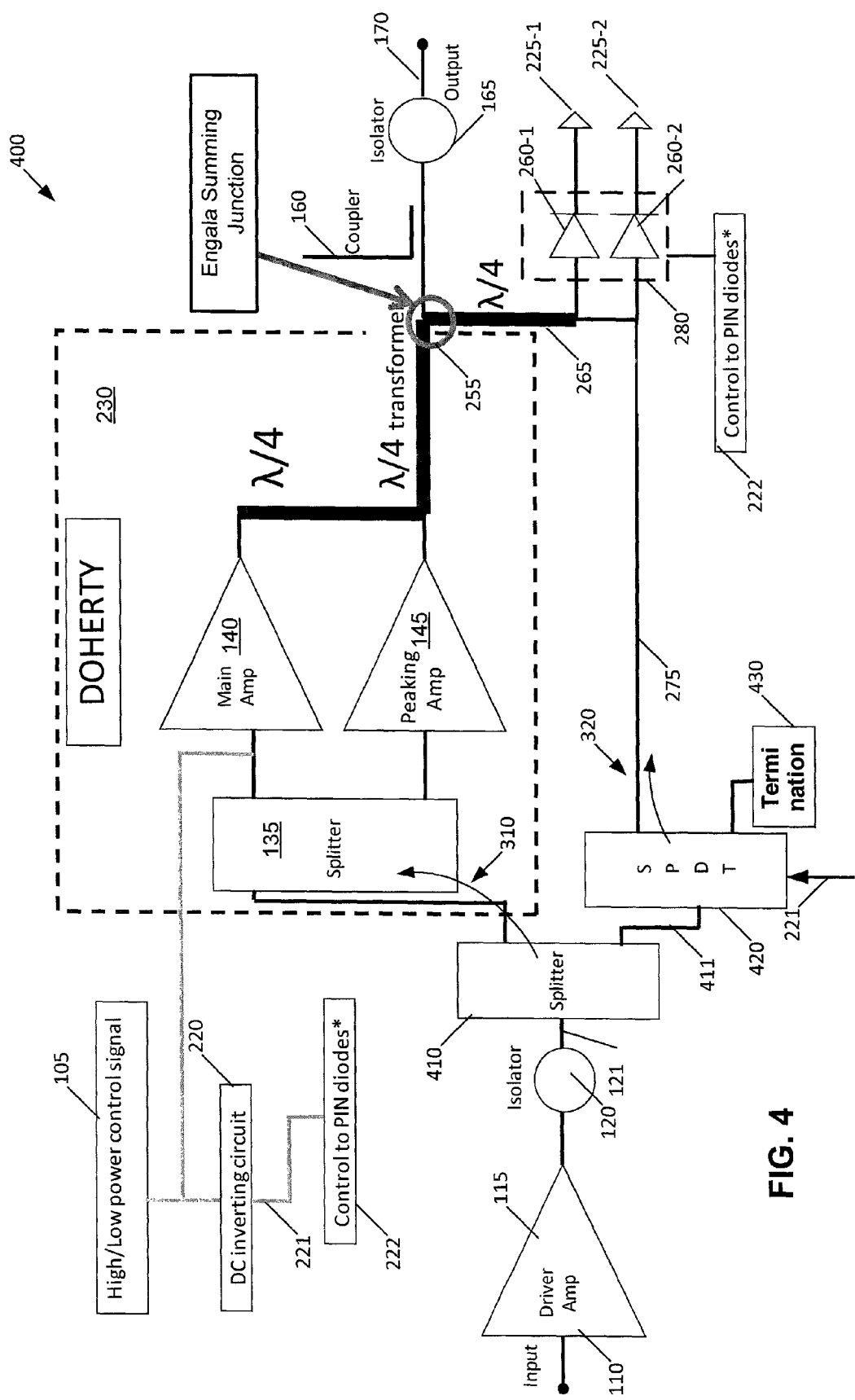
FIGS. 4-6 are illustrations of power amplifier architectures using a Doherty power amplifier structure, in accordance with exemplary embodiments of the instant invention.
Figure 5:
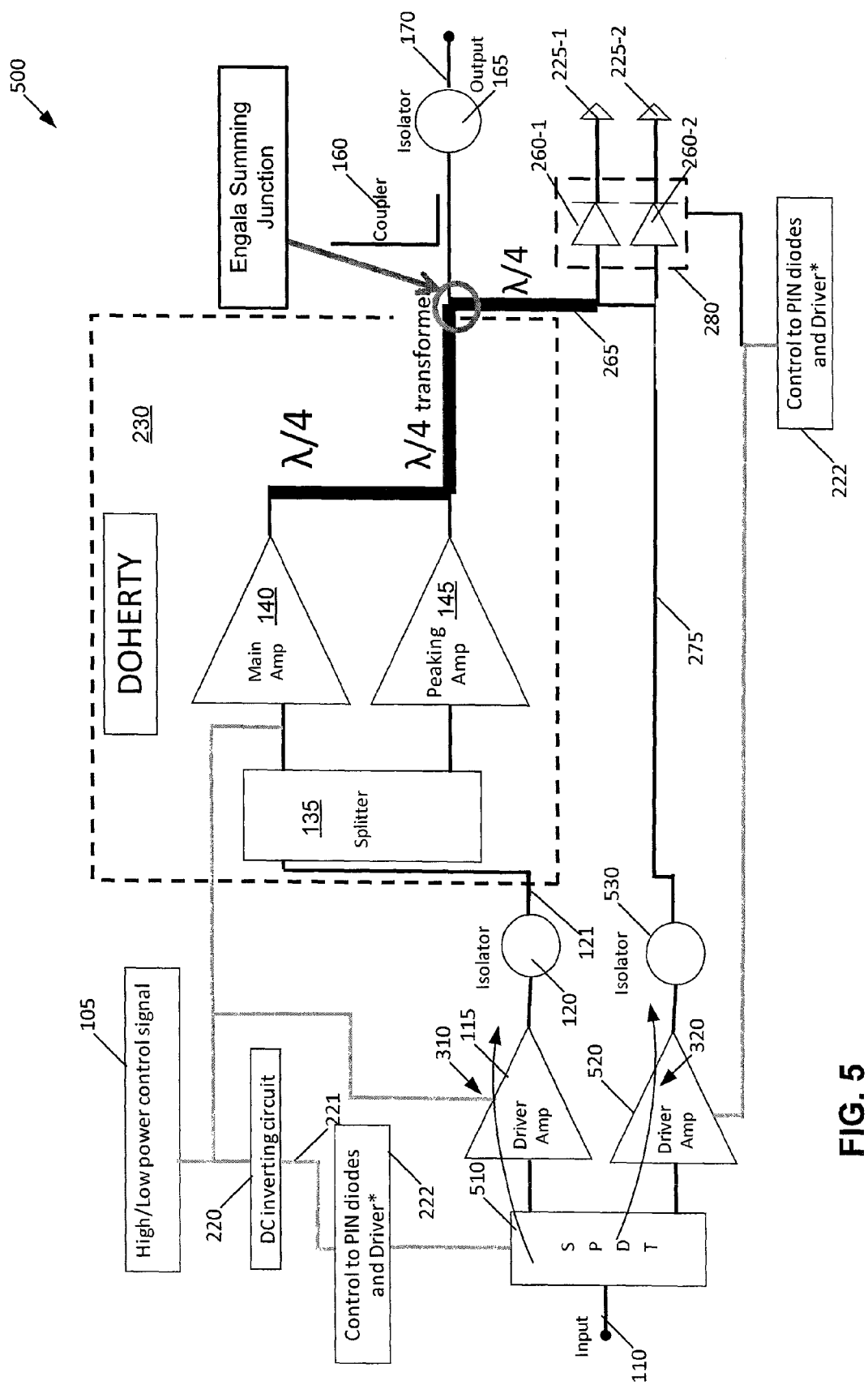
Figure 6:
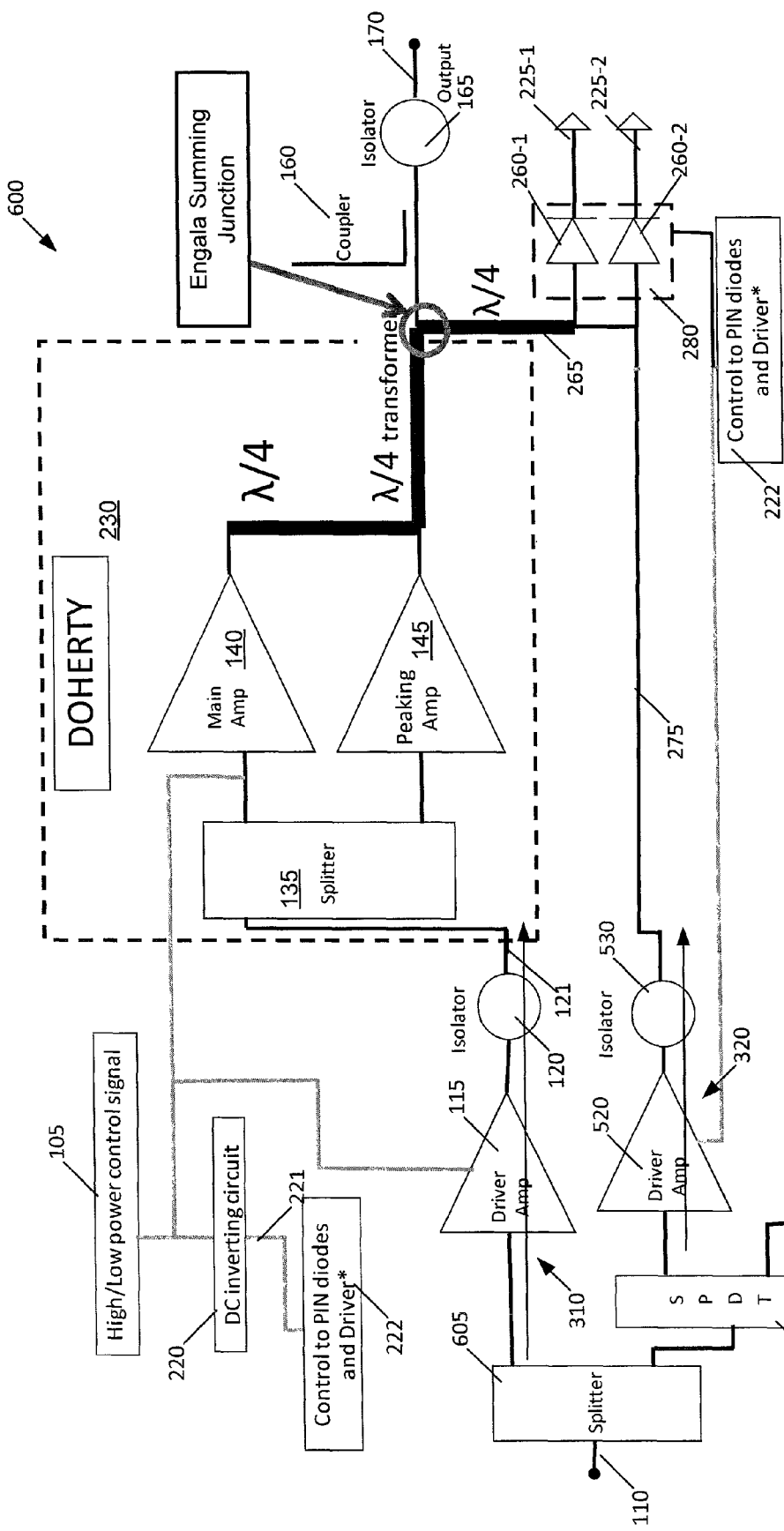

FIGS. 4-6 are illustrations of power amplifier architectures using a Doherty power amplifier, in accordance with exemplary embodiments of the instant invention. Since most of the elements in FIGS. 4-6 have been described above in reference to FIGS. 2A, 2B, 3A, and 3B, mainly the elements that are different in FIGS. 4-6 are described herein.

Turning to FIG. 4, this figure illustrates an architecture 400 having Doherty amplifier structure 230 ON/OFF using a splitter 410. The splitter 410 splits the signal to the splitter 135 and an SPDT switch 420. The high power mode has a high power path 310 where the Doherty power amplifier structure 230 is ON, the driver amplifier 115 is ON, and the PIN diodes 260-1, 260-2 are ON (i.e., they create a short). The high power mode causes the signal 121 to be routed from the driver amplifier 115 through the SPDT switch 420 to the termination 430. A reason for the termination 430 is that this example uses a splitter, half the power will go to SPDT switch 420 even in high power mode and that energy should be terminated so that isolation and VSWR (voltage standing wave ratio) issues are not created. The low power mode has a low power path 320 where the Doherty power amplifier structure 230 is OFF, the driver amplifier 115 is ON, and the PIN diodes 260-1, 260-2 are OFF (i.e., they create an open). The low power path 320 starts at the SPDT switch 420, passes through the signal line 275, through the impedance transformer 265 to the Engala summing junction 255. The signal 221 from the DC inverting circuit 220 also goes to the SPDT switch 420.

Referring to FIG. 5, an architecture 500 is shown. The input 110 is connected to an SPDT switch 510. The high power mode has a high power path 310 where the Doherty power amplifier structure 230 is ON, the driver amplifier 115 is ON, and the PIN diodes 260-1, 260-2 are ON (i.e., they create a short). The high power path 310 is routed through the SPDT switch 510, through the driver amplifier 115, through the isolator 120, and to the signal 121. The low power mode has a low power path 320 where the Doherty power amplifier structure 230 is OFF, the driver amplifier 115 is ON, and the PIN diodes 260-1, 260-2 are OFF (i.e., they create an open). The low power path goes through the SPDT switch 510, through the driver amplifier 520, through the isolator 530, and to the signal line 275. The signal 221 from the DC inverting circuit 220 turns ON/OFF the main amplifier 140 and the driver amplifier 115 (i.e., both the main amplifier 140 and the driver amplifier 115 would be either ON or OFF at the same time). The signal 221 from the DC inverting circuit 220 also is routed as control signal 222 to the SPDT switch 510, the driver amplifier 520, and the PIN diodes 260-1, 260-2.

Turning to FIG. 6, a power amplifier architecture 600 is shown. The input signal 110 is connected to a splitter 605 that splits the input signal 110 between a driver amplifier 115 and an SPDT switch 610. The high power mode has a high power path 310 where the Doherty power amplifier structure 230 is ON, the driver amplifier 115 is ON, and the PIN diodes 260-1, 260-2 are ON (i.e., they create a short). The high power path 310 is routed through the splitter 605, through the driver amplifier 115, through the isolator 120, and to the signal line 121. The low power mode has a low power path 320 where the Doherty power amplifier structure 230 is OFF, the driver amplifier 115 is ON, and the PIN diodes 260-1, 260-2 are OFF (i.e., they create an open). The low power path 320 goes through the splitter 605, through the SPDT switch 510, through the driver amplifier 520, through the isolator 530, and to the signal line 275. The signal line 221 from the DC inverting circuit 220 turns ON/OFF the main amplifier 140 and the driver amplifier 115 (i.e., both the main amplifier 140 and the driver amplifier 115 would be either ON or OFF at the same time) and also controls the SPDT switch 610. The signal 221 from the DC inverting circuit 220 also is routed as control signal 222 to the SPDT switch 510, the driver amplifier 520, and the PIN diodes 260-1, 260-2. The termination 620 is used when the high power path 310 is active. A reason for the termination 620 is that this example uses a splitter, half the power will go to SPDT switch 610 even in high power mode and that energy should be terminated so that isolation and VSWR (voltage standing wave ratio) issues are not created.

Figure 7:
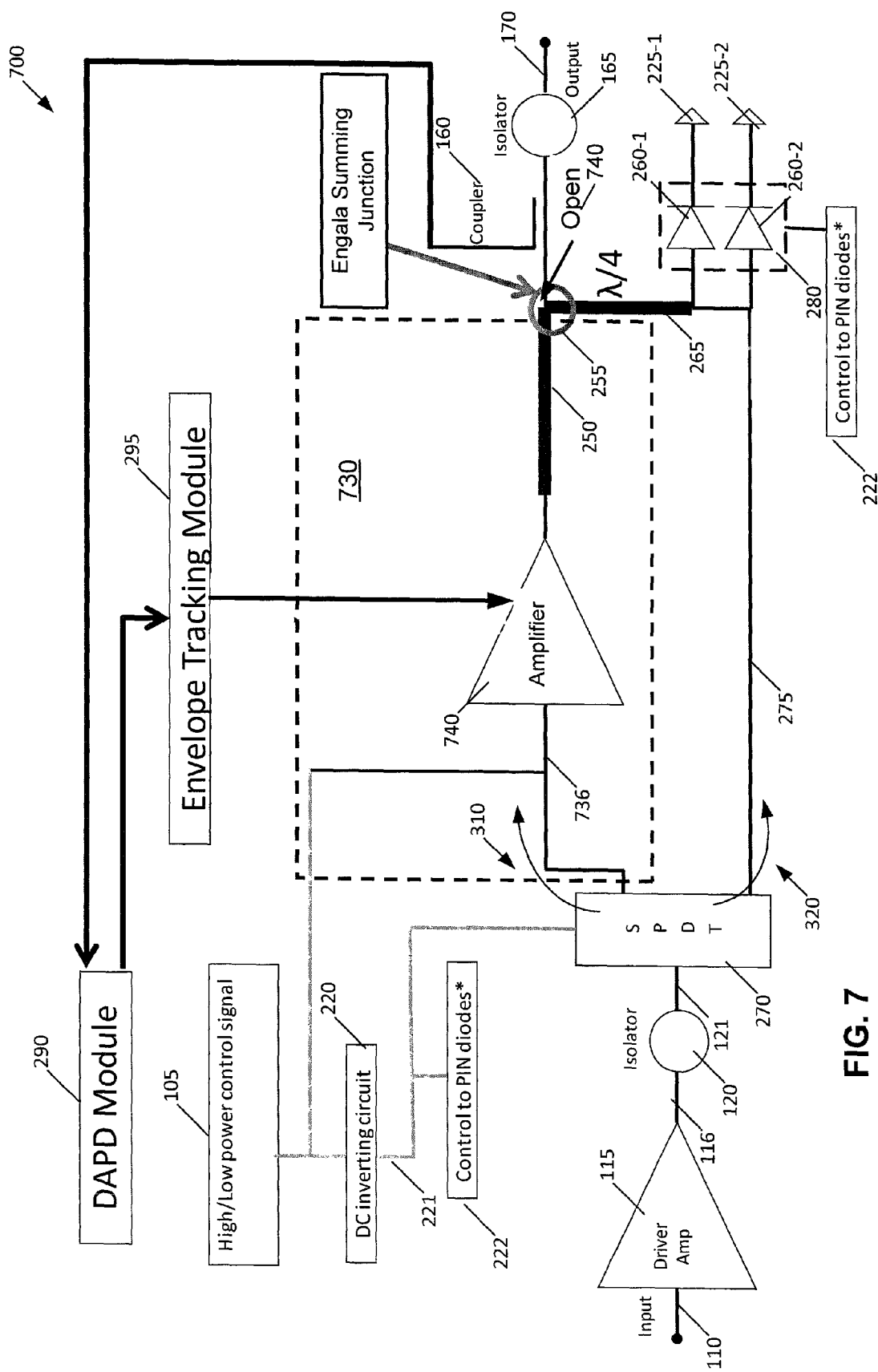
FIGS. 7 and 8 are illustrations of power amplifier architectures, comprising a single power amplifier structure, in accordance with exemplary embodiments of the instant invention.
Figure 8:
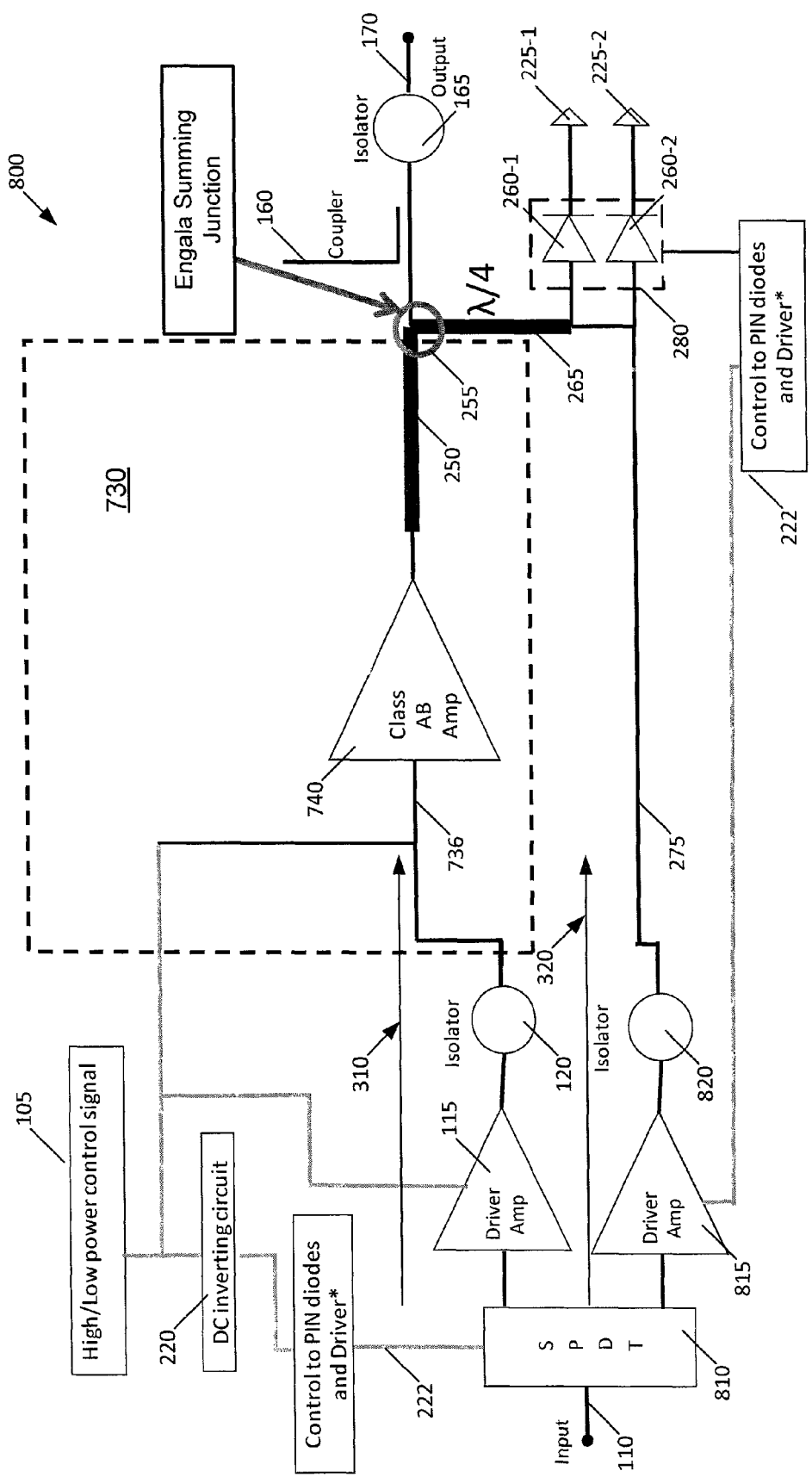

FIGS. 7 and 8 are illustrations of power amplifier architectures, comprising a single power amplifier structure instead of a Doherty power amplifier structure, in accordance with exemplary embodiments of the instant invention. Referring to FIG. 7, this figure shows a power amplifier architecture 700 that is similar to the architecture 200 shown in FIG. 2A, and mainly the differences are described herein. The Doherty power amplifier structure 230 is replaced with a single amplifier structure 730 comprising an amplifier 740 that outputs to the impedance transformer 250 (e.g., a quarter wave, λ/4, transformer). The high power path 310 starts at the SPDT switch 270 and is routed through a signal 736, to and through the amplifier 740, and to and through the transformer 250. The low power path 310 starts at SPDT switch 270, is routed to and through the signal line 275, and to and through the impedance transformer 265. The operation is similar to the operation of FIGS. 3A and 3B, described previously. Concerning the amplifier structure 230, class AB matching (i.e., if the amplifier 740 is class AB) and line length matching (for the impedance transformer 250) are used to create an open 740 at the Engala summing junction 255 (e.g., looking into the impedance transformer 250) when the amplifier 740 is in the OFF state.

FIG. 8 illustrates a power amplifier architecture 800 that is similar to the architecture 700 shown in FIG. 7, and mainly the differences are described herein. In this example, the input signal 110 is fed through an SPDT switch 810, which selects either the driver amplifier 115 (and the corresponding high power path 310) or the driver amplifier 815 (and the corresponding low power path 320). The low power path also includes an isolator 820. The DC inverting circuit 220 in this example outputs a control signal 22 that controls switching of the SPDT switch 810, and the ON/OFF state for the driver amplifier 815 and the PIN diodes 260-1, 260-2. The control signal 105, meanwhile, controls the ON/OFF states for the driver amplifier 115 and the amplifier 740 (i.e., such that both are ON or OFF at the same time).

All the architectures presented above are compatible with digital pre distortion and can be used in conjunction with DAPD. Furthermore, all the architectures presented above will be compatible with envelope tracking and the efficiency can be improved even further. Additionally, all the architectures presented above can be used with envelope tracking and digital pre-distortion together.

Figure 9:
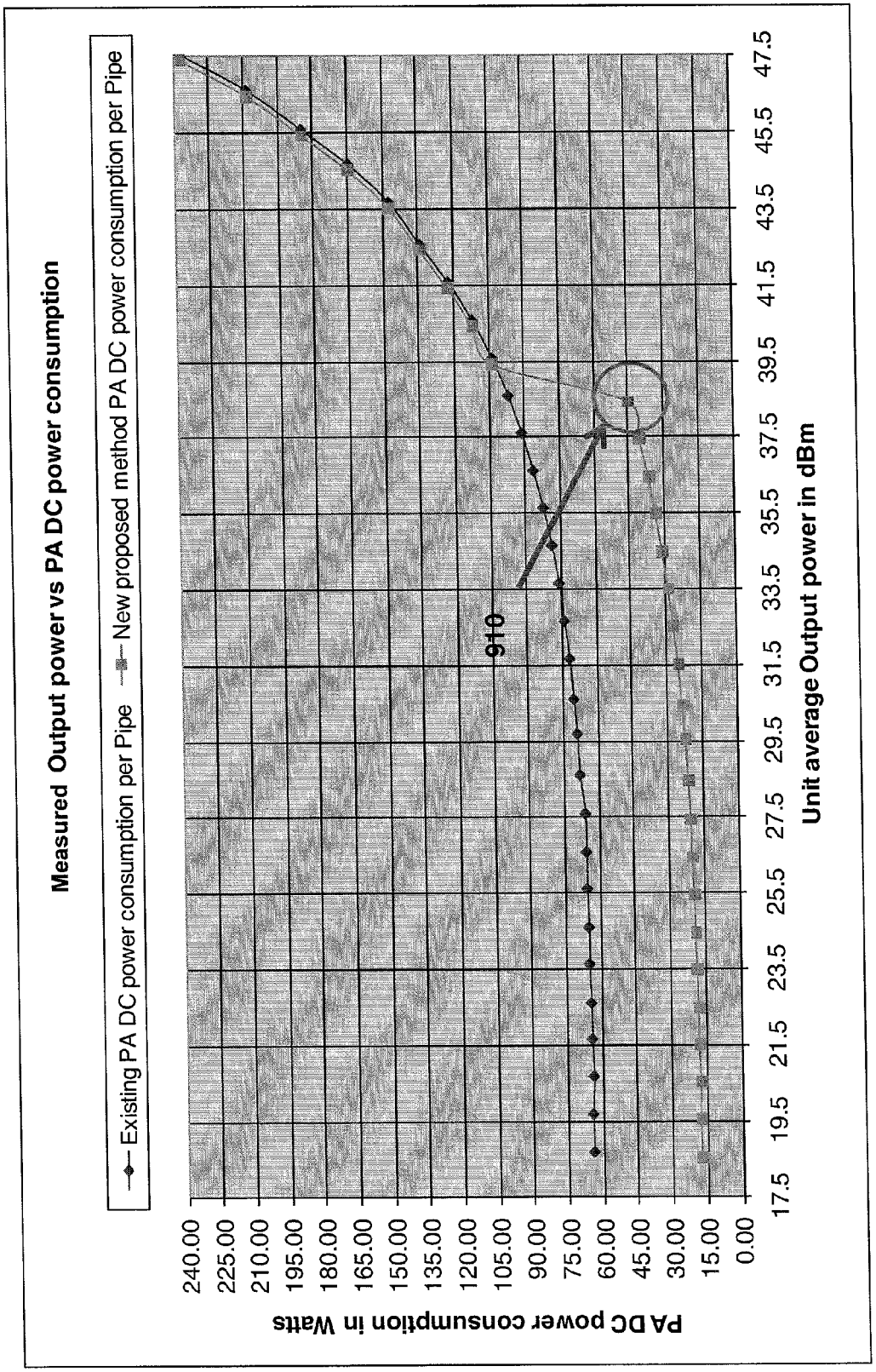
FIG. 9 is a plot showing DC power consumption measured results for 60 W PA modules with existing and proposed architectures.

FIG. 9 is a plot showing DC power consumption measured results for 60 W PA modules with existing and proposed architectures. The switching point 910 will depend on the 3 dB compression point (P3 dB) of the driver amplifier (e.g., 115) and the amount of gain margin in the Tx chain to accommodate the reduction in gain due to the final PA stage. Assuming the PAR of 7.4 dB, this is the point where one can switch to low power mode but if the PAR is lower, the switching can happen sooner and this will result in higher power savings.

As shown in FIG. 9, there is a savings of about 45-50 watts per PA in low power mode. The switching point 910 shown is about 10-12% (percent) of rated power with 7.4 dB PAR. The switching point 910 can move to 20-25% of rated power depending in the PAR of the overhead channel power of WCDMA or LTE (e.g., 3.2 dB PAR for overhead channels of WCDMA and LTE). The previously described architectures can be used in LTE and WCDMA base stations during off peak hours. Based on certain example traffic pattern numbers, this architecture can be used for 8-10 hours per day. The numbers used may be, e.g., sample WCDMA traffic load model based on ETSI TS 102 706 V 1.6.1 (2011-06) document.

It is expected that about 45-50 watts of power savings per pipe may be seen with proposed architecture for power levels PL5-PL15. This can be from PL2-PL15 depending on the composite PAR. The max unit average power is 47.8 dBm (60 watts) and this includes the maximum PAR of 7.3 dB. Assuming that a base station is always transmitting 7.3 dB PAR, the base station can switch to a low power path for unit average power of PL5 or lower. The P3 dB of driver is 48 dBm and this dictates the switch over point to low power path. If the PAR of the composite signal is less than 7.3 dB PAR, the base station can switch to low power path as early as PL2 or PL3. Since the switching between high power and low power path is before the coupler 160, there should not be any effect on the DAPD. An extra 1-1.5 dB loss has been considered for the low power path to take care of losses due to the switch and reverse biased diodes. This loss and P3 dB of driver determines where the base station performs the switch over. A loss of 0.15 dB has been considered in the forward path because the diodes 260 will not provide a perfect open and that is the reason the line for the new PA architecture is little bit above the line for the existing PA architecture in the plot in FIG. 8. The amount of power saving will be less for certain base stations, as the PLO power is only 40 watts, as compared to 60 watts in other base stations. In similar way, the power saving might be more in base stations where the PLO is 80 watts (e.g., or higher).

Figure 10:
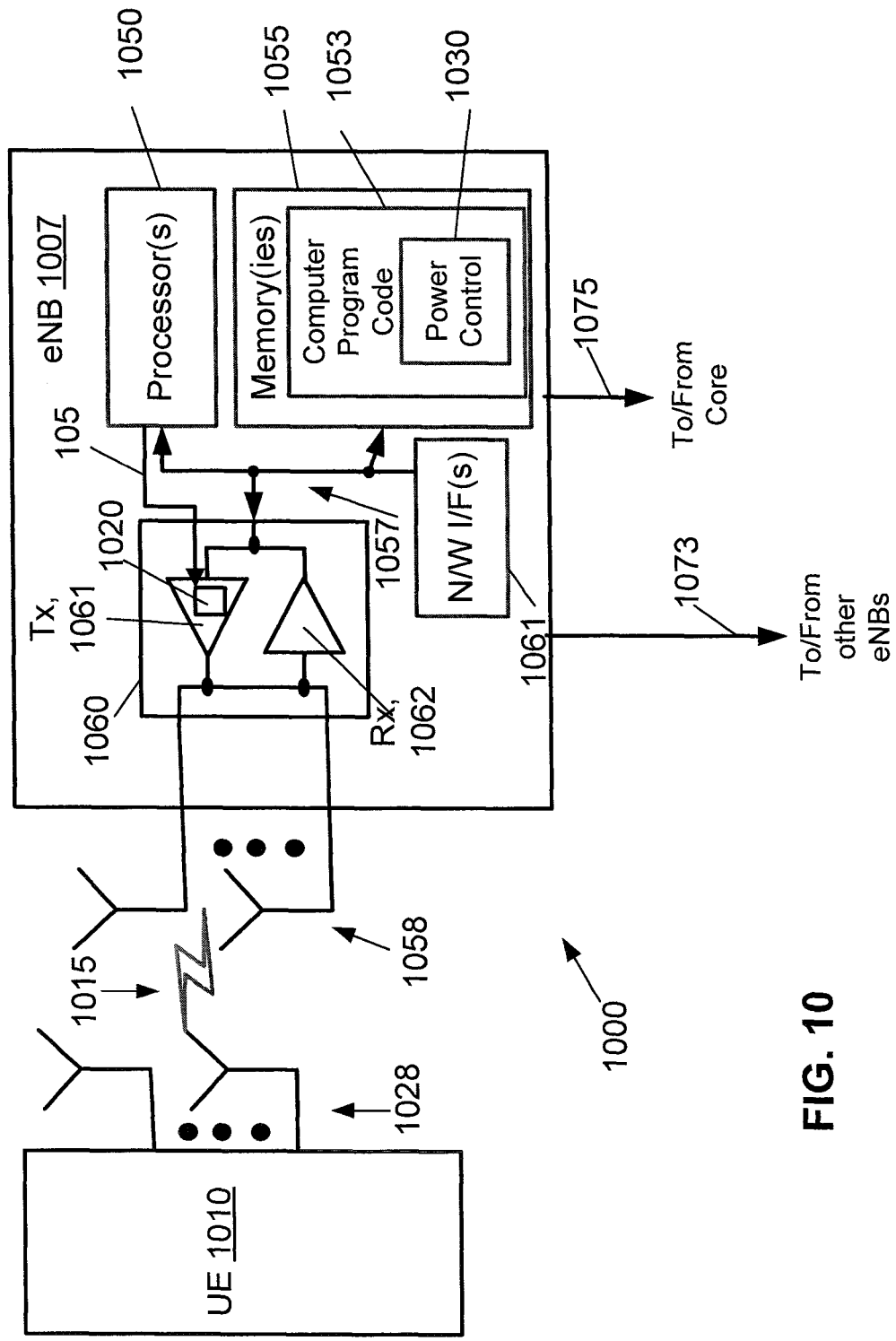
FIG. 10 illustrates an exemplary system in which the exemplary embodiments of the instant invention may be practiced.

Reference is now made to FIG. 10, which illustrates an exemplary system in which the exemplary embodiments of the instant invention may be practiced. In FIG. 10, a user equipment (UE) 1010 is in wireless communication with a wireless network 1000 via a wireless link 1015-1 with eNB 1007, which is an LIE base station (in this example) providing access to (e.g., and from) the wireless network 1000. The user equipment 110 includes one or more antennas 1028. Note that FIG. 10 shows a single pipe/power amplifier design, and a typical eNB would have multiple such pipes/power amplifiers, typically three.

Figure 11:
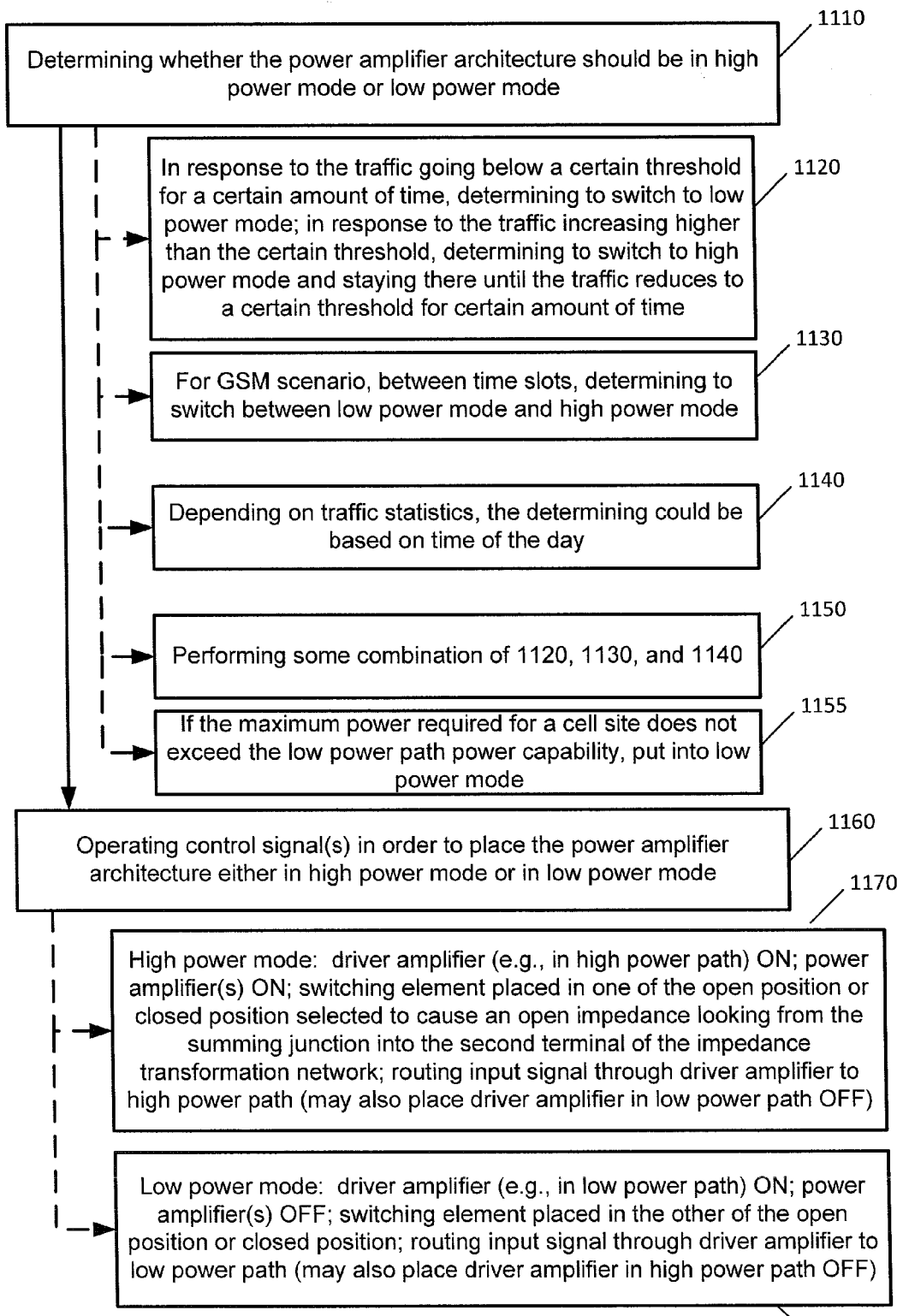
FIG. 11 is a logic flow diagram that illustrates the operation of a method, and a result of execution of computer program instructions embodied on a computer readable medium, in accordance with the exemplary embodiments of this invention.

The network 1000 includes an eNB 1007. The eNodeB 1007 includes one or more processors 1050, one or more memories 1055, one or more network interfaces (N/W I/F(s)) 1061, and one or more transceivers 1060 (each comprising a transmitter, Tx, 1061 and a receiver, Rx, 1062) interconnected through one or more buses 1057. In the transmitter 1061, there is a power amplifier architecture 1020. The power amplifier architecture 1020 can be any of the power amplifier architectures previously described. The one or more transceivers 1060 are connected to one or more antennas 1058. The one or more memories 1055 include computer program code 1053, which in this example comprises a power control functionality 1030. The one or more memories 1055 and the computer program code 1053 are configured to, with the one or more processors 150, cause the eNodeB 107 to perform one or more of the operations as described herein. For instance, the one or more processors 1050 can control the control signal 105 (as shown in FIG. 11) and therefore the other control signals 221, 222. That is, the one or more processors 1050, e.g., under control of the computer program code 1053, can cause the eNB 1007 to place the power amplifier architecture 1020 (e.g., one of the architectures 200, 400, 500, 600, 700, or 800) in either high power mode or low power mode. The control signal 105 may be separate from the buses 1057 or part of the buses 1057.

The one or more network interfaces 1061 communicate over networks such as the networks 1073, 1075. The eNB 1007 may communicate with other eNBs using, e.g., network 1073. The network 173 may be wired or wireless or both and may implement, e.g., an X2 interface as specified in TS 36.423. The eNB 1007 may use the network 1075 to communicate with a core portion of the wireless network 1000.

The computer readable memory 1055 may be of any type suitable to the local technical environment and may be implemented using any suitable data storage technology, such as semiconductor based memory devices, flash memory, magnetic memory devices and systems, optical memory devices and systems, fixed memory and removable memory. The processor(s) 1050 may be of any type suitable to the local technical environment, and may include one or more of general purpose computers, special purpose computers, microprocessors, digital signal processors (DSPs) and processors based on a multi-core processor architecture, as non-limiting examples.

The power control functionality 1030 comprises functionality to control the power level of the transmitter 1061. Exemplary operations of the power control functionality 1030 are shown in FIG. 11. FIG. 11 is a logic flow diagram that illustrates the operation of a method, and a result of execution of computer program instructions embodied on a computer readable medium, in accordance with the exemplary embodiments of this invention. The power control functionality 1030 controls the eNB 1007 to perform the operations shown. In block 1110, the power control functionality 1030 controls the eNB 1007 to perform the operation of determining whether the power amplifier architecture should be in high power mode or low power mode. Examples of claim 1110 are given by blocks 1120 through 1140.

One example of block 1110 is shown in block 1120, where the power control functionality 1030 controls the eNB 1007 to perform the operation of, in response to the traffic going below a certain threshold for a certain amount of time, determining to switch to low power mode. In response to the traffic increasing higher than the certain threshold, the eNB 1007 then performs determining to switch to high power mode and staying there until the traffic reduces to a certain threshold for certain amount of time. Another example of block 1110 is block 1130, where for a GSM scenario (e.g., operation of the power amplifier architecture for GSM), the power control functionality 1030 controls the eNB 1007 to perform the operation of, between time slots for transmission, determining to switch between low power mode and high power mode. That is, once transmission is complete for a time slot, low power mode may be entered until there is a requirement for the next time slot and only if the power of the next timeslot cannot be supported by the low power path. The GSM scenario may work, e.g., because the switching element 280 and other switches (e.g., 270) can be made suitably fast typically in tens of nanoseconds. In block 1140, another example is that, depending on traffic statistics, the determining could be based on time of the day. For instance, this could mean based on a sample (e.g., 1 week/1 month/1 year) of traffic pattern data, the base station can be put in low power mode for the time of the day that the data suggests. In block 1150, the power control functionality 1030 controls the eNB 1007 to perform the operation of performing some combination of 1120, 1130, and 1140. In block 1155, if the maximum power required for a cell site does not exceed the low power path power capability, the power control functionality 1030 puts the cell into low power mode. That is, if the cell needs a maximum power that is less than the power capability of the low power path, the cell can stay in the low power mode.

In block 1160, the power control functionality 1030 controls the eNB 1007 to perform the operation of operating control signal(s) in order to place the power amplifier architecture (e.g., 200, 400, 500, 600, 700, 800) either in high power mode or in low power mode. In the previous examples, a control signal is the high/low power control signal 105, and operation of this single signal is assumed to control the power amplifier architecture (via the other signals 221, 222) to place the power amplifier architecture in the high or low power mode. The one or more processors 1050 may, for instance, set or clear the control signal 105 in order to cause the power amplifier architecture to be placed into a corresponding mode. It should be noted, however, that multiple control signals may be used. For instance, the DC inverting circuit 220 might not be used and the one or more processors 1050 can create control signals 105 and 221 (and 222, if 222 is separate from 221).

One example of block 1160 is shown in block 1170, where, for high power mode, a driver amplifier (e.g., in the high power path 310) is in an ON state; the power amplifier(s) (e.g., main amplifier 140 or 740) is placed in the ON state; the switching element 280 is placed in one of the open position or closed position selected to cause an open impedance looking from the summing junction into the second terminal of the impedance transformation network; and routing is performed to route the input signal 110 through a driver amplifier to a high power path 310. Regarding driver amplifiers, these may or may not be placed in the ON or OFF states. For instance, the single driver amplifier 115 in FIGS. 2A, 4, and 7 may be in the ON state at all times while the eNB 1007 is active. In FIGS. 5, 6, and 8, the driver amplifier 115 in the high power path 310 may be placed in the ON state (via control signal 105) and the corresponding driver amplifier 520, 520, and 815 in the low power path 320 is placed in the OFF state (via control signal 222).

One example of block 1160 is shown in block 1180, where, for low power mode, a driver amplifier (e.g., in the low power path 320) is in an ON state; the power amplifier(s) (e.g., main amplifier 140 or 740) is placed in the ON state; the switching element 280 is placed in the other of the open position or closed position; and routing is performed to route the input signal 110 through a driver amplifier to a high power path 310. As previously described, regarding driver amplifiers, these may or may not be placed in the ON or OFF states. For instance, the single driver amplifier 115 in FIGS. 2A, 4, and 7 may be in the ON state at all times while the eNB 1007 is active. In FIGS. 5, 6, and 8, the corresponding driver amplifier 520, 520, and 815 in the low power path 320 is placed in the ON state (via control signal 222), the driver amplifier 115 in the high power path 310 may be placed in the OFF state (via control signal 105).

The amplifier structures shown above are not limited to Doherty or single amplifier structures. Example of other amplifier structures include push-pull amplifiers, 3 way Doherty amplifiers, Asymmetric Doherty amplifiers, 4 way combined amplifiers, or feed forward amplifiers.

Embodiments of the present invention may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 10. A computer-readable medium may comprise a computer-readable storage medium (e.g., memory(ies) 1055 or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:

CDMA Code Division Multiple Access
DAPD Digital Adaptive Pre-Distortion
dB decibel
dBm decibel milliwatts (the power ratio in dB of the measured power referenced to one milliwatt, mW)
DC Direct Current
eNB eNode B (LTE base station)
PET Field Effect Transistor
GSM Global System for Mobile communications
LTE Long Term Evolution
PA Power Amplifier
PAR Peak-to-Average Ratio
RAT Radio Access Technology
RF Radio Frequency
SPDT Single Pole, Double Throw
Tx Transmission or Transmitter
VSWR Voltage Standing Wave Ratio
WCDMA Wideband Code Division Multiple Access

What is claimed is:

1. An apparatus, comprising:
a power amplifier architecture, comprising:
a high power path comprising one or more amplifiers having one or more outputs coupled to an input of an impedance transformer, the impedance transformer having an output;
a low power path comprising a signal line and an impedance transformation network, the impedance transformation network having a first terminal coupled to the signal line and a second terminal coupled to the output of the impedance transformer;
a switching element having a first terminal coupled to the signal line and having a second terminal coupled to ground, the switching element in a closed position shorting the signal line to ground and in an open position providing an open between the signal line and ground;
a summing junction having an output and summing the output of the impedance transformer and the second terminal of the impedance transformation network; and circuitry, responsive to one or more control signals, configured in a high power mode to turn on at least one of the one or more amplifiers, to route an input signal through a driver amplifier to the high power path and to place the switching element in one of the open position or closed position selected to cause an open impedance looking from the summing junction into the second terminal of the impedance transformation network, the circuitry configured in a low power mode to turn off the at least one amplifier, to route the input signal through a driver amplifier to the low power path and to place the switching element in the other of the open position or closed position, wherein the circuitry is configured to route the input signal to one path of the high power path or the low power mode but not to both paths.

2. The apparatus of claim 1, wherein the high power path further comprises a splitter having an input and two outputs and comprises a second impedance transformer, wherein the one or more amplifiers comprise a main amplifier and a peaking amplifier, each of which having an input coupled to one of the two outputs of the splitter, wherein the output of the peaking amplifier is coupled to the input of the impedance transformer, and wherein the output of the main amplifier is coupled to a first terminal of the second impedance transformer and a second terminal of the second impedance transformer is coupled to the input of the impedance transformer.

3. The apparatus of claim 2, wherein the power amplifier architecture further comprises a single driver amplifier and wherein the circuitry comprises a switch comprising an input and two outputs, wherein an input of the single driver amplifier is suitable for accepting the input signal, wherein an output of the single driver amplifier is coupled to the input of the switch, and wherein the switch is responsive to the one or more control signals to direct an amplified signal from the driver amplifier to either the high power path over a first output of the switch or the low power path over a second output of the switch.

4. The apparatus of claim 2, wherein:
the power amplifier architecture further comprises a single driver amplifier, a second splitter having an input and two outputs, and a termination;
the circuitry comprises a switch comprising an input and two outputs, an input of the single driver amplifier is suitable for accepting the input signal;
an output of the single driver amplifier is coupled to the input of the splitter;
a first output of the second splitter is coupled to an input of the high power path;
a second output of the second splitter is coupled to the input of the switch; and
the switch is responsive to the one or more control signals to direct an amplified signal from the driver amplifier either to the signal line of the low power path over a first output of the switch or to the termination over a second output of the switch.

5. An apparatus, comprising:
a power amplifier architecture, comprising:
a high power path comprising one or more amplifiers having one or more outputs coupled to an input of an impedance transformer, the impedance transformer having an output;
a low power path comprising a signal line and an impedance transformation network, the impedance transformation network having a first terminal coupled to the signal line and a second terminal coupled to the output of the impedance transformer;

a switching element having a first terminal coupled to the signal line and having a second terminal coupled to ground, the switching element in a closed position shorting the signal line to ground and in an open position providing an open between the signal line and ground;

a summing junction having an output and summing the output of the first impedance impedance transformer and the second terminal of the impedance transformation network; and circuitry, responsive to one or more control signals, configured in a high power mode to turn on at least one of the one or more amplifiers, to route an input signal through a driver amplifier to the high power path and to place the switching element in one of the open position or closed position selected to cause an open impedance looking from the summing junction into the second terminal of the impedance transformation network, the circuitry configured in a low power mode to turn off the at least one amplifier, to route the input signal through a driver amplifier to the low power path and to place the switching element in the other of the open position or closed position:

wherein the high power path further comprises a splitter having an input and two outputs and comprises a second impedance transformer, wherein the one or more amplifiers comprise a main amplifier and a peaking amplifier, each of which having an input coupled to one of the two outputs of the splitter, wherein the output of the peaking amplifier is coupled to the input of the impedance transformer, and wherein the output of the main amplifier is coupled to a first terminal of the second impedance transformer and a second terminal of the second impedance transformer is coupled to the input of the impedance transformer;

wherein the circuitry comprises a switch having an input suitable for accepting the input signal and two outputs;

wherein the high power path comprises a first driver amplifier having an input coupled to a first output of the switch and an output coupled to the input of the splitter;

wherein the low power path comprises a second driver amplifier having an input coupled to a second output of the switch and an output coupled to the signal line;

wherein the switch is responsive to the one or more control signals to route the input signal to the input of the first driver amplifier in the high power mode and to route the input signal to the input of the second driver amplifier in the low power mode.

6. The apparatus of claim 5, wherein the circuitry is further configured, responsive to the one or more control signals, to turn on the first driver amplifier in the high power mode, to turn off the first driver amplifier in the low power mode, to turn on the second driver amplifier in the low power mode, and to turn off the second driver amplifier in the high power mode.

7. The apparatus of claim 2, wherein:
the splitter in the high power path is a first splitter;
the power amplifier architecture further comprises a second splitter having an input for accepting the input signal and having two outputs and comprises a termination;
the high power path comprises a first driver amplifier having an input coupled to a first output of the second splitter and an output coupled to the input of the first splitter;
the circuitry comprises a switch having an input coupled to a second output of the second splitter and having two outputs;
the low power path comprises a second driver amplifier having an input coupled to a second output of the switch and an output coupled to the signal line;
the switch is responsive to the one or more control signals to route the input signal to the input of the second driver amplifier in the high power mode and to route the input signal to an input of the termination in the low power mode.

8. The apparatus of claim 6, wherein the circuitry is further configured, responsive to the one or more control signals, to turn on the first driver amplifier in the high power mode, to turn off the first driver amplifier in the low power mode, to turn on the second driver amplifier in the low power mode, and to turn off the second driver amplifier in the high power mode.

9. The apparatus of claim 1, wherein the one or more amplifiers is a single amplifier having a single output coupled to the input of the impedance transformer.

10. The apparatus of claim 9, wherein:
the circuitry comprises a switch having an input suitable for accepting the input signal and two outputs;
the high power path comprises a first driver amplifier having an input coupled to a first output of the switch and an output coupled to the input of the single amplifier;
the low power path comprises a second driver amplifier having an input coupled to a second output of the switch and an output coupled to the signal line;
the switch is responsive to the one or more control signals to route the input signal to the input of the first driver amplifier in the high power mode and to route the input signal to the input of the second driver amplifier in the low power mode.

11. The apparatus of claim 10, wherein the circuitry is further configured, responsive to the one or more control signals, to turn on the first driver amplifier in the high power mode, to turn off the first driver amplifier in the low power mode, to turn on the second driver amplifier in the low power mode, and to turn off the second driver amplifier in the high power mode.

12. The apparatus of claim 1, further comprising a digital adaptive pre-distortion module coupled to the one or more amplifiers.

13. The apparatus of claim 1, further comprising an envelope tracking module coupled to the one or more amplifiers.

14. The apparatus of claim 1, further comprising one or more processors configured to determine whether the power amplifier architecture should be in the high power mode or in the low power mode and configured to operate the one or more control signals in order to place the power amplifier architecture either in the high power mode or in the low power mode.

15. The apparatus of claim 1, wherein the switching element comprises at least one of one or more PIN diodes, a varactor, one or more field effect transistors, one or more mechanical switches, or one or more bipolar transistors, wherein a combination of the switching element and the transformation network is configured such that if the switching element is in the selected one of the open position or closed position, the open impedance looking from the summing junction into the second terminal of the impedance transformation network is created.

16. A computer program product comprising a computer-readable storage medium bearing computer program code embodied therein for use with a computer, the computer program code comprising:

code for determining whether a power amplifier architecture should be in high power mode or low power mode, the power amplifier architecture comprising:
  a high power path comprising one or more amplifiers having one or more outputs coupled to an input of an impedance transformer, the impedance transformer having an output;
  a low power path comprising a signal line and an impedance transformation network, the impedance transformation network having a first terminal coupled to the signal line and a second terminal coupled to the output of the impedance transformer;
  a switching element having a first terminal coupled to the signal line and having a second terminal coupled to ground, the switching element in a closed position shorting the signal line to ground and in an open position providing an open between the signal line and ground;
  a summing junction having an output and summing the output of the impedance transformer and the second terminal of the impedance transformation network; and
  circuitry, responsive to one or more control signals, configured in a high power mode to turn on at least one of the one or more amplifiers, to route an input signal through a driver amplifier to the high power path and to place the switching element in one of the open position or closed position selected to cause an open impedance looking from the summing junction into the second terminal of the impedance transformation network, the circuitry configured in a low power mode to turn off the at least one amplifier, to route the input signal through a driver amplifier to the low power path and to place the switching element in the other of the open position or closed position; and
code for operating the one or more control signals in order to place the power amplifier architecture in one of the high power mode or in the low power mode, wherein the circuitry is configured by the code to route the input signal to one path of the high power path in the high power mode or the low power path in the low power mode but not to both paths.

17. The computer program-product according to claim 16 wherein determining whether a power amplifier architecture should be in high power mode or low power mode further comprises, in response to traffic going below a certain threshold for certain amount of time, determining to switch to low power mode; and, in response to the traffic increasing higher than the certain threshold, determining to switch to the high power mode and staying in the high power mode until the traffic reduces to the certain threshold for the certain amount of time.

18. The computer program product according to claim 16, wherein determining whether a power amplifier architecture should be in high power mode or low power mode further comprises for operation with the global system for mobile communications, between time slots for transmission, determining to switch from high power mode used for transmission to low power mode until there is a requirement for the next time slot and only if the power of the next time slot cannot be supported by the low power path.

19. The computer program product according to claim 16, determining whether a power amplifier architecture should be in high power mode or low power mode further comprises performing the determining based at least in part on time of day and traffic statistics for the time of day.

20. The computer program product according to claim 16, wherein determining whether a power amplifier architecture should be in high power mode or low power mode further comprises if the maximum power required for a cell site does not exceed the low power path power capability, determining the power amplifier architecture should be in low power mode.

* * * * *

UNITED STATES PATENT AND TRADEMARK OFFICE
CERTIFICATE OF CORRECTION

| | | |
|---|---|---|
| PATENT NO. | : 8,742,842 B2 | Page 1 of 1 |
| APPLICATION NO. | : 13/590482 | |
| DATED | : June 3, 2014 | |
| INVENTOR(S) | : Kodanda R. Engala and Darrell Barabash | |

It is certified that error appears in the above-identified patent and that said Letters Patent is hereby corrected as shown below:

In the Claims

In Claim 5:
Column 15, line 7, "impedance impedance" should be deleted and --impedance-- should be inserted.

Signed and Sealed this
Twenty-third Day of September, 2014

Michelle K. Lee
*Deputy Director of the United States Patent and Trademark Office*